(12) United States Patent
Crawford et al.

(10) Patent No.: US 10,348,347 B2
(45) Date of Patent: Jul. 9, 2019

(54) APPARATUS FOR MONITORING RADIO FREQUENCY SIGNALS

(71) Applicant: BAE SYSTEMS INFORMATION AND ELECTRONIC SYSTEMS INTEGRATION INC., Nashua, NH (US)

(72) Inventors: Anthony J. Crawford, Milford, NH (US); Christopher N. Peters, Nashua, NH (US); Nathaniel J. Conway, Nashua, NH (US); Kurt M. Foley, Deerfield, NH (US); John C. Joseph, Merrimack, NH (US); Mason Tremblay, Milford, NH (US); Daniel W. Glass, Brookline, NH (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 38 days.

(21) Appl. No.: 15/626,688

(22) Filed: Jun. 19, 2017

(65) Prior Publication Data

US 2019/0020367 A1    Jan. 17, 2019

(51) Int. Cl.
| | | |
|---|---|---|
| *H04B 1/06* | (2006.01) | |
| *H04B 1/16* | (2006.01) | |
| *H04B 1/26* | (2006.01) | |
| *H03H 11/04* | (2006.01) | |
| *H03H 7/32* | (2006.01) | |
| *H03K 9/06* | (2006.01) | |

(52) U.S. Cl.
CPC ............ *H04B 1/1638* (2013.01); *H03H 7/325* (2013.01); *H03H 11/04* (2013.01); *H04B 1/26* (2013.01); *H03K 9/06* (2013.01)

(58) Field of Classification Search
CPC ...... H04B 1/1638; H04B 1/06; H04B 1/1036; H04B 1/16; H04B 1/26
See application file for complete search history.

(56) References Cited

U.S. PATENT DOCUMENTS

| | | | |
|---|---|---|---|
| 3,573,817 A | 4/1971 | Akers | |
| 6,917,328 B2 | 7/2005 | Rabinowitz et al. | |
| 7,460,615 B2* | 12/2008 | Kunysz | G01S 19/32 342/352 |
| 7,830,987 B2* | 11/2010 | Bhoja | H04L 7/0062 375/326 |

* cited by examiner

*Primary Examiner* — Tuan Pham
(74) *Attorney, Agent, or Firm* — Antony P. Ng; Russell Ng PLLC; Scott J. Asmus

(57) ABSTRACT

An apparatus for monitoring radio frequency (RF) signals is disclosed. The apparatus includes an RF splitter, a set of track-and-hold circuits, a set of analog-to-digital circuits (ADC) and a frequency tracking module. The RF splitter splits a set of incoming RF signals into multiple RF signal paths. Each of the track-and-hold circuits, which is clocked at a different frequency than others, samples the incoming RF signals from a respective one of the RF signal paths. Each of the ADCs receives the sampled data from a respective one of the track-and-hold circuits. Each of the ADCs is also clocked at same frequency as a corresponding one of the track-and-hold circuits. The frequency tracking module determines a frequency of the incoming RF signals.

19 Claims, 3 Drawing Sheets

| measured using data sampled at 400 MHz  21 | measured using data sampled at 380 MHz  22 | measured using data sampled at 358 MHz  23 | actual signal frequency  24 |
|---|---|---|---|
| 25 | 25 | 25 | 25 |
| 50 | 50 | 50 | 50 |
| 75 | 75 | 75 | 75 |
| 100 | 100 | 100 | 100 |
| 125 | 125 | 125 | 125 |
| 150 | 150 | 150 | 150 |
| 175 | 175 | 175 | 175 |
| 200 | 180 | 158 | 200 |
| 175 | 155 | 133 | 225 |
| 150 | 130 | 108 | 250 |
| 125 | 105 | 83 | 275 |
| 100 | 80 | 58 | 300 |
| 75 | 55 | 33 | 325 |
| 50 | 30 | 8 | 350 |
| 25 | 5 | 17 | 375 |
| 0 | 20 | 42 | 400 |
| 25 | 45 | 67 | 425 |
| 50 | 70 | 92 | 450 |
| 75 | 95 | 117 | 475 |
| 100 | 120 | 142 | 500 |
| 125 | 145 | 167 | 525 |
| 150 | 170 | 166 | 550 |
| 175 | 185 | 141 | 575 |
| 200 | 120 | 32 | 1400 |
| 175 | 95 | 7 | 1425 |
| 150 | 70 | 18 | 1450 |
| 75 | 115 | 159 | 875 |
| 125 | 45 | 43 | 1475 |
| 100 | 20 | 68 | 1500 |
| 75 | 5 | 93 | 1525 |
| 175 | 115 | 49 | 1025 |
| 150 | 90 | 24 | 1050 |
| 125 | 65 | 1 | 1075 |
| 100 | 40 | 26 | 1100 |
| 50 | 90 | 134 | 850 |
| 75 | 115 | 159 | 875 |
| 100 | 140 | 174 | 900 |

*Figure 2*

APPARATUS FOR MONITORING RADIO FREQUENCY SIGNALS

STATEMENT OF GOVERNMENT INTEREST

The present disclosure was made with government support under Contract No. 13-c-8027 awarded by a classified customer. The United States Government has certain rights in the inventions.

TECHNICAL FIELD

The present disclosure relates to radio signal scanners in general, and in particular to an apparatus for monitoring radio frequency signals.

BACKGROUND

Radio frequency (RF) signal scanners, such police scanners and electronic warfare systems, can be utilized to detect the presence of signals of interest across the electromagnetic spectrum. It is common for RF signal scanners to sweep across a broad range of frequencies to find the signals of interest before locking onto a signal to observe it more closely and provide an appropriate response.

With a police scanner, a response may include converting the RF signal to an audio signal that can be heard through audio speakers. With an electronic warfare system, a response may include utilizing the RF signal to cue the electronic warfare system to transmit a RF jamming waveform at the appropriate frequency.

The present disclosure is related to an apparatus for monitoring the RF environment across a wide range of frequencies in order to detect and measure parameters of relevant RF signals.

SUMMARY

In accordance with one embodiment of the present system, an apparatus for monitoring radio frequency (RF) signals includes an RF splitter, a set of track-and-hold circuits, a set of analog-to-digital circuits (ADC) and a frequency tracking module. The RF splitter splits a set of incoming RF signals into multiple RF signal paths. The track-and-hold circuits, which are clocked at a different frequency than others, sample the incoming RF signals from a respective RF signal path. One or more of the ADCs receive the sampled data from a respective track-and-hold circuit. The ADCs are also clocked at the same frequency as a corresponding track-and-hold circuit. The frequency tracking module determines a frequency of the incoming RF signals.

The features and advantages described herein are not all-inclusive and, in particular, many additional features and advantages will be apparent to one of ordinary skill in the art in view of the drawings, specification and claims. Moreover, it should be noted that the language used in the specification has been selected principally for readability and instructional purposes and not to limit the scope of the inventive subject matter.

BRIEF DESCRIPTION OF THE DRAWINGS

The invention itself, as well as its modes of use, further objects, and advantages thereof, will best be understood by reference to the following detailed description of an illustrative embodiment when read in conjunction with the accompanying drawings, wherein:

FIG. 2 is a look-up table located within the digital receiver from FIG. 1, in accordance with one embodiment.

DETAILED DESCRIPTION

Figure 1:
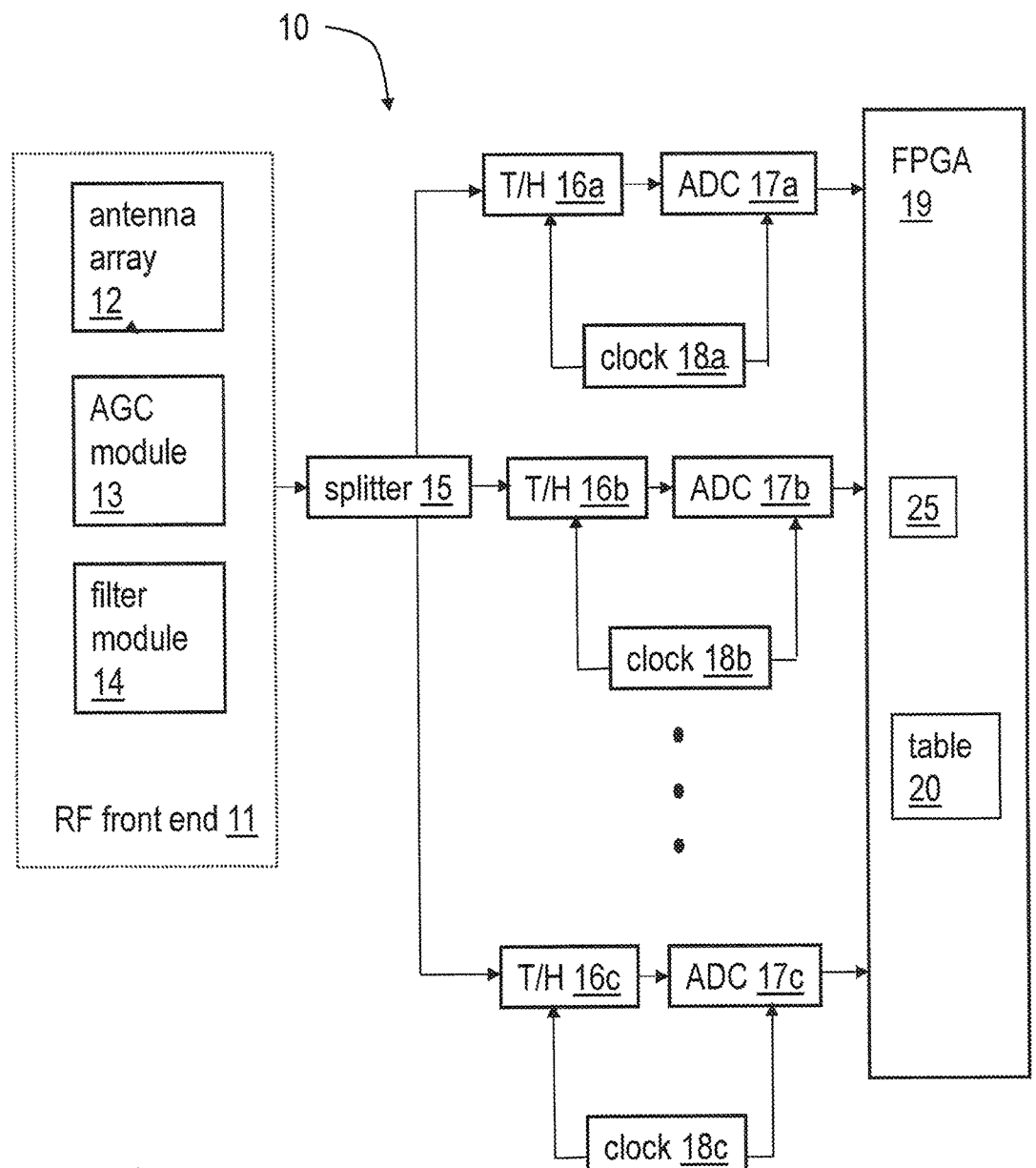
FIG. 1 is a block diagram of a digital receiver for detecting and monitoring radio frequency signals, in accordance with one embodiment.

Referring now to the drawings and in particular to FIG. 1, there is illustrated a block diagram of a digital receiver for detecting and monitoring radio frequency (RF) signals, in accordance with one embodiment. As shown, a digital receiver 10 includes an RF front end 11, an RF splitter 15, track-and-hold circuits 16a-16c, analog-to-digital converters (ADCs) 17a-17c and a field-programmable gate array (FPGA) 19. In this example, RF front end 11 includes an antenna array 12, an automatic gain control (AGC) module 13, and a filter module 14.

RF signals are initially received by antenna array 12, and the received RF signals are sent to AGC module 13. In this example, AGC module 13 includes a coupler and a digital attenuator. The RF signal from the coupled off port is input into a log video detector, and the output of the log video detector is digitized and fed into a complex programmable logic device (CPLD). The amplitude of the signal is measured within the CPLD. Based on the amplitude of the RF signals, the digital attenuators in the RF path are set to limit the power going into the input ports of filter module 14. This approach allows high power signals to be attenuated quickly, if necessary, in order to prevent digital receiver 10 from operating in saturation.

From AGC module 13, the received RF signals are then sent to filter module 14. In one example, filter module 14 includes a high-band filter, a mid-band filter and a low-band filter. The filters may include, for example, a first band-pass filter of 50 MHz to 3 GHz, a second band-pass filter of 50 MHz to 200 MHz, and a third band-pass filter of 20 MHz to 400 MHz. Although three band-pass filters are used in the present embodiment, it is understood by those skilled in the art that other types and any number of filters can be utilized. A user can select one of the band-pass filters that includes a frequency range of interest. After passing through one of the band-pass filters, the output RF signals are limited in the total bandwidth.

RF splitter 15 is then utilized to split the RF signals from filter module 14 into, for example, three RF signal paths. Each of the three RF signal paths is fed to a respective one of track-and-hold circuits 16a-16c, and each of the track-and-hold outputs is subsequently presented to a respective one of ADCs 17a-17c. This is done such that each of ADCs 17a-17c sees the same RF signal with the about the same power level at the input. One purpose of track-and-hold circuits 16a-16c is to expand the analog bandwidth of ADCs 17a-17c. Each of ADCs 17a-17c samples the common RF signals at different sampling frequencies via clocks 18a-18c, respectively. For the present embodiment, the frequencies of clocks 18a-18c utilized to drive each track-and-hold/ADC pair are, for example, 400 MHz, 380 MHz, and 358 MHz. In other words, 400 MHz, 380 MHz, and 358 MHz clock signals from clocks 18a-18c are sent to track-and-hold circuits 16a-16c, respectively, and to ADCs 17a-17c, respectively. These frequencies can be generated using three phase-locked loop circuits that all share a common reference clock. It is noted that although there are three track-and-hold circuits and three respective ADC circuits shown in this example, there can be more or less track-and-hold/ADC pairings.

The wide bandwidth track-and-hold circuits 16a-16c and ADC circuits 17a-17c in combination with sampling the same RF signal at multiple sampling rates enables the alias resolution in FPGA 19 to determine the frequency. This enables much wider instantaneous bandwidth with lower speed sampling and eliminates the need and cost for complex RF circuitry on RF front end 11.

To uniquely determine the original frequency of the incoming signal, in one example, the clock frequencies are chosen such that the least common multiple of the clock frequencies divided by two is greater than the highest frequency of the input signal. This allows the system to be useful across multiple Nyquist zones instead of only one as in conventional systems. A Nyquist zone can be defined as the range of frequencies between positive integer multiples of the clocking frequency divided by two.

The digital output of each of ADCs 17a-17c is then sent to FPGA 19 where the three digitized signals are available to be passed through various DSP algorithms within a parameter measurement block 25 to filter, detect, and measure parameters such as amplitude and frequency of the incoming signal. Because the input signal can have a frequency up to many times higher than the sampling rates, the measured frequency cannot uniquely represent the frequency of the actual input signal if the data from only one of ADCs 17a-17c were to be utilized. However, the three measured frequencies can be utilized to uniquely determine the actual frequency of the incoming RF signals via a look-up table 20. The parameters and digital data from one of the three RF signal paths and the uniquely determined frequency are available to be used within FPGA 19 and can be used for a variety of applications that require the detection of a signal and measurement of the frequency of incoming RF signals.

With reference now to FIG. 2, there is illustrated an example of look-up table 20, according to one embodiment. As shown, look-up table 20 includes columns 21-24 having multiple rows. Each entry in column 21 corresponds to ADC 17a that handles data sampled at 400 MHz. Each entry in column 22 corresponds to ADC 17b that handles data sampled at 380 MHz. Each entry in column 23 corresponds to ADC 17c that handles data sampled at 358 MHz. Each entry in column 24 is the actual signal frequency for that corresponding row.

As an example, if the measured frequencies are 125 MHz, 145 MHz and 167 MHz at ADC 17a (400 MHz), ADC 17b (380 MHz) and ADC 17c (358 MHz), respectively, then the actual frequency of the received RF signal is found to be 525 MHz in column 24 of look-up table 20.

As another example, if the measured frequencies are 125 MHz, 45 MHz and 43 MHz at ADC 17a (400 MHz), ADC 17b (380 MHz) and ADC 17c (358 MHz), respectively, then the actual frequency of the received RF signal is found to be 1,475 MHz in column 24 of look-up table 20.

The size of look-up table 20 is directly related to the resolution of look-up table 20. In other words, a higher resolution of frequency determination can be provided by a larger look-up table 20.

After the frequency of the RF signal of interest has been determined, an appropriate response can be commenced depending upon the application. In an electronic warfare scenario, if the RF signal of interest is a jamming signal, the electronic warfare electronics can switch to a different frequency band of operation or otherwise cancel or filter the jamming signal. If the RF signal of interest is a communications signal, it can be processed for audible presentation.

Figure 3:
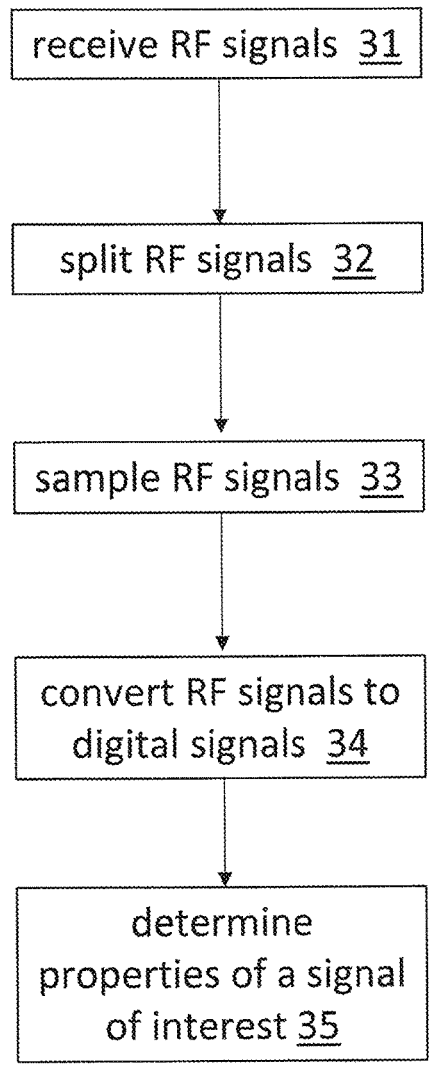
FIG. 3 is a process flow diagram of a method for detecting and monitoring radio frequency signals, in accordance with one embodiment.

Referring now to FIG. 3, there is depicted a process flow diagram of a method for detecting and monitoring radio frequency signals, in accordance with one embodiment. Initially, a set of RF signals is received, as shown in block 31. The received RF signals are then split into multiple RF signal paths, as depicted in block 32. The received RF signals in each of the RF signal paths is sampled at a different clock frequency, as shown in block 33. The sampled RF signals in each of the RF signal paths is converted to digital signals at the different clock frequency, but same clock frequency in the corresponding RF signal path, as depicted in block 34. Finally, the frequency of the received RF signals is determined, as shown in block 35.

As has been described, the present invention provides an apparatus for detecting and monitoring RF signals.

While the invention has been particularly shown and described with reference to a preferred embodiment, it will be understood by those skilled in the art that various changes in form and detail may be made therein without departing from the spirit and scope of the invention.

What is claimed is:

1. An apparatus for monitoring radio frequency (RF) signals, said apparatus comprising:
   an RF splitter for splitting a set of incoming RF signals into a plurality of RF signal paths;
   a plurality of track-and-hold circuits coupled to respective RF signal paths, wherein said track-and-hold circuits are clocked at a different frequency;
   a plurality of analog-to-digital circuits (ADC) coupled to respective track-and-hold circuit, receiving sampled data from the track-and-hold circuit, wherein the respective ADC is clocked at a same frequency as the respective track-and-hold circuit; and
   a frequency tracking module for determining a frequency of said incoming RF signals.

2. The apparatus of claim 1, wherein said apparatus further includes an antenna array for receiving said incoming RF signals.

3. The apparatus of claim 2, wherein said apparatus further includes an automatic gain control module for controlling said incoming RF signals in order to prevent said apparatus from operating in saturation.

4. The apparatus of claim 3, wherein said apparatus further includes a filter module having a plurality of filters for filtering said incoming RF signals.

5. The apparatus of claim 4, wherein said filters are selectable by a user.

6. The apparatus of claim 1, wherein said different frequencies are generated by a common reference clock.

7. The apparatus of claim 1, wherein said frequency tracking module further includes a look-up table.

8. An apparatus for monitoring radio frequency (RF) signals, said apparatus comprising:
   an RF splitter for splitting a set of incoming RF signals into a first RF signal path, a second RF signal path and a third RF signal path;
   a first track-and-hold circuit, clocked at a first frequency, for sampling said incoming RF signals from said first RF signal path;
   a second track-and-hold circuit, clocked at a second frequency, for sampling said incoming RF signals from said second RF signal path;

a third track-and-hold circuit, clocked at a third frequency, for sampling said incoming RF signals from said third RF signal path;

a first analog-to-digital circuit (ADC), clocked at said first frequency, for receiving sampled data from said first track-and-hold circuit;

a second ADC, clocked at said second frequency, for receiving sampled data from said second track-and-hold circuit;

a third ADC, clocked at said third frequency, for receiving sampled data from said third track-and-hold circuit; and a frequency tracking module for determining a frequency of said incoming RF signals, wherein the first frequency, the second frequency, and the third frequency are different frequencies.

9. The apparatus of claim 8, wherein said apparatus further includes an antenna array for receiving said incoming RF signals.

10. The apparatus of claim 9, wherein said apparatus further includes an automatic gain control module for controlling said incoming RF signals in order to prevent said apparatus from operating in saturation.

11. The apparatus of claim 10, wherein said apparatus further includes a filter module having a plurality of filters for filtering said incoming RF signals.

12. The apparatus of claim 11, wherein said filters are selectable by a user.

13. The apparatus of claim 8, wherein said frequency tracking module further includes a look-up table.

14. A method for monitoring radio frequency (RF) signals, said method comprising:

receiving a set of RF signals;

splitting said received RF signals into a plurality of RF signal paths;

sampling said received RF signals at a different clock frequency for each of said RF signal paths;

converting said sampled RF signals to digital signals at the different clock frequency for each of said RF signal paths; and determining a frequency of said received RF signals.

15. The method of claim 14, wherein said filters are selectable by a user.

16. The method of claim 14, wherein said sampling further includes sampling said filtered RF signals at a different clock frequency for each of said RF signal paths via a corresponding track-and-hold circuit.

17. The method of claim 14, wherein said converting further includes converting said sampled RF signals to digital signals at a different clock frequency for each of said RF signal paths via a corresponding analog-to-digital circuit.

18. The method of claim 14, wherein said determining further includes determining a frequency of said received RF signals via a look-up table.

19. The method of claim 14, further comprising filtering said look-up table.

* * * * *